United States Patent
Chang

(10) Patent No.: US 7,845,396 B2
(45) Date of Patent: Dec. 7, 2010

(54) HEAT DISSIPATION DEVICE WITH COARSE SURFACE CAPABLE OF INTENSIFYING HEAT TRANSFER

(75) Inventor: Shih-Wei Chang, Kaohsiung (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 161 days.

(21) Appl. No.: 11/781,953

(22) Filed: Jul. 24, 2007

(65) Prior Publication Data

US 2009/0025911 A1 Jan. 29, 2009

(51) Int. Cl.
*F28F 13/12* (2006.01)
(52) U.S. Cl. .................... 165/109.1; 165/133
(58) Field of Classification Search ............ 165/109.1, 165/133
See application file for complete search history.

(56) References Cited

U.S. PATENT DOCUMENTS

| 2,596,642 | A | * | 5/1952 | Boestad ............... 165/166 |
| 3,741,285 | A | * | 6/1973 | Kuethe ............... 165/181 |
| 4,984,626 | A | * | 1/1991 | Esformes et al. ......... 165/151 |
| 5,361,828 | A | * | 11/1994 | Lee et al. ............ 165/109.1 |
| 5,833,389 | A | * | 11/1998 | Sirovich et al. .......... 405/52 |
| 6,644,388 | B1 | * | 11/2003 | Kilmer et al. ........... 165/133 |
| 6,883,597 | B2 | * | 4/2005 | Thors et al. ............ 165/133 |
| 2006/0254751 | A1 | * | 11/2006 | Sinha ................ 165/80.3 |

FOREIGN PATENT DOCUMENTS

DE 10161732 A1 * 7/2003
JP 02037294 A * 2/1990

\* cited by examiner

*Primary Examiner*—Allen J Flanigan

(57) ABSTRACT

A heat dissipation device with coarse surface capable of intensifying heat transfer includes a main body and a heat transfer intensifying unit. The main body provides a surface and the heat transfer intensifying unit is disposed on the surface. The heat transfer intensifying unit further includes at least a raised part and a plurality of fish-scale-like parts. The raised parts are disposed slightly upright from said surface and spacing apart a distance from each other. The fish-scale-like parts each are disposed on the surface of the main body next to the raised parts orderly, provide a recess toward the surface of the main body with an inclining angle from the surface of the main body, have a vertical edge and a sharp end and the sharp end is formed at an intersection of the vertical edge of the respective fish-scale-like part. The raised parts and the fish-scale-like parts allow fluid near the surface of the main body creating eddy flows, secondary flows and breaking boundary layers of the fluid for promoting rate of heat transfer.

9 Claims, 4 Drawing Sheets

HEAT DISSIPATION DEVICE WITH COARSE SURFACE CAPABLE OF INTENSIFYING HEAT TRANSFER

BACKGROUND OF THE INVENTION

1. Field of the Invention

The present invention is related to a heat dissipation device with coarse surface capable of intensifying heat transfer and particularly to a heat dissipation device capable of promoting efficiency of heat transfer.

2. Brief Description of the Related Art

Due to precision of the electronic components being fabricated more precise than before, much more heat is generated by the electronic components accordingly. As a result, it is considerably insufficient to dissipate the heat to the ambient environment with the conventional natural or forced convection. Mostly, the current way to dissipate the heat is in that the heat sink is provided at the heat source side to guide the heat out. The cooling fins of the heat sink transmit the heat to the ambient environment naturally or forcedly.

However, there are some problems are still unable to be overcome while the popularly employed heat sink with a fan is in operation. For instance, temperature difference between the surfaces of the cooling fins and the airflow passing through the heat sink is merely 5-10° C. and it results in inadequate temperature gradient, and material and structure of the heat sink cause thermal resistance. The preceding problems lead to the conventional heat sink being incapable of dissipating larger amount of heat and the electronic components malfunctioning arose from heat dissipation.

Taiwan Utility Model Application No. 90220898, entitled "HEAT EXCHANGE FIN CAPABLE OF CREATING EDDY FLOW", discloses a fin with several recesses and projections at the surface thereof and two or more pieces of the fins are combined to allow the projections on two adjacent fins contacting with each other. While the fins are assembled as a single unit, work fluid flows through the assembled fins along one-dimensional direction or two-dimensional directions. In this way, the work fluid not only passes through passages between resistant members formed with the recesses and projections but also hits the resistant members and changes both moving direction and moving speed thereof. Under this circumference, phenomenon of turbulence created by the work fluid is intensified to increase thermal convection effect between the work fluid and the respective fin.

However, the preceding prior art still has problems while in practice. The flow passage is reduced because of the resistant members between the fins and a great deal of reversed pressure is created to lessen fluid input. Next, frictional resistance is formed between the work fluid and the surface of the respective fin and between the work fluid and the resistant members, that is, there are two-dimensional fluid frictional resistant forces retarding the fluid speed. Further, thickness of boundary layer increases along with flow distance and, under this circumference, the thermal resistance increases accordingly to influence effect of heat transfer. Thus, heat is incapable of being carried out effectively.

SUMMARY OF THE INVENTION

In order to overcome the preceding deficiencies of the prior art, an object of the present invention is to provide a heat device capable of promoting effect of heat transfer.

Another object of the present invention is to provide a heat dissipation device capable of breaking the boundary layer and lowering the thermal resistance.

A further object of the present invention is to provide a heat dissipation device with which a plurality of fish-scale-like parts on a surface thereof to allow the fluid creating eddy flows along the edges of the fish-scale-like parts to constitute the secondary flow with the main flow of the fluid for enhancing effect of heat transfer.

In order to achieve the preceding objects, a heat dissipation device with coarse surface capable of intensifying heat transfer according to the present invention includes a main body and a heat transfer intensifying unit. The main body provides a surface and the heat transfer intensifying unit is disposed on the surface. The heat transfer intensifying unit further includes at least a raised part and a plurality of fish-scale-like parts. The raised part is disposed slightly upright from said surface and spacing apart a distance from each other. The fish-scale-like parts each are disposed on the surface of the main body next to the raised part orderly, provide a recess toward the surface of the main body with an inclining angle from the surface of the main body and have a vertical edge, which is formed at an intersection of the vertical edge.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
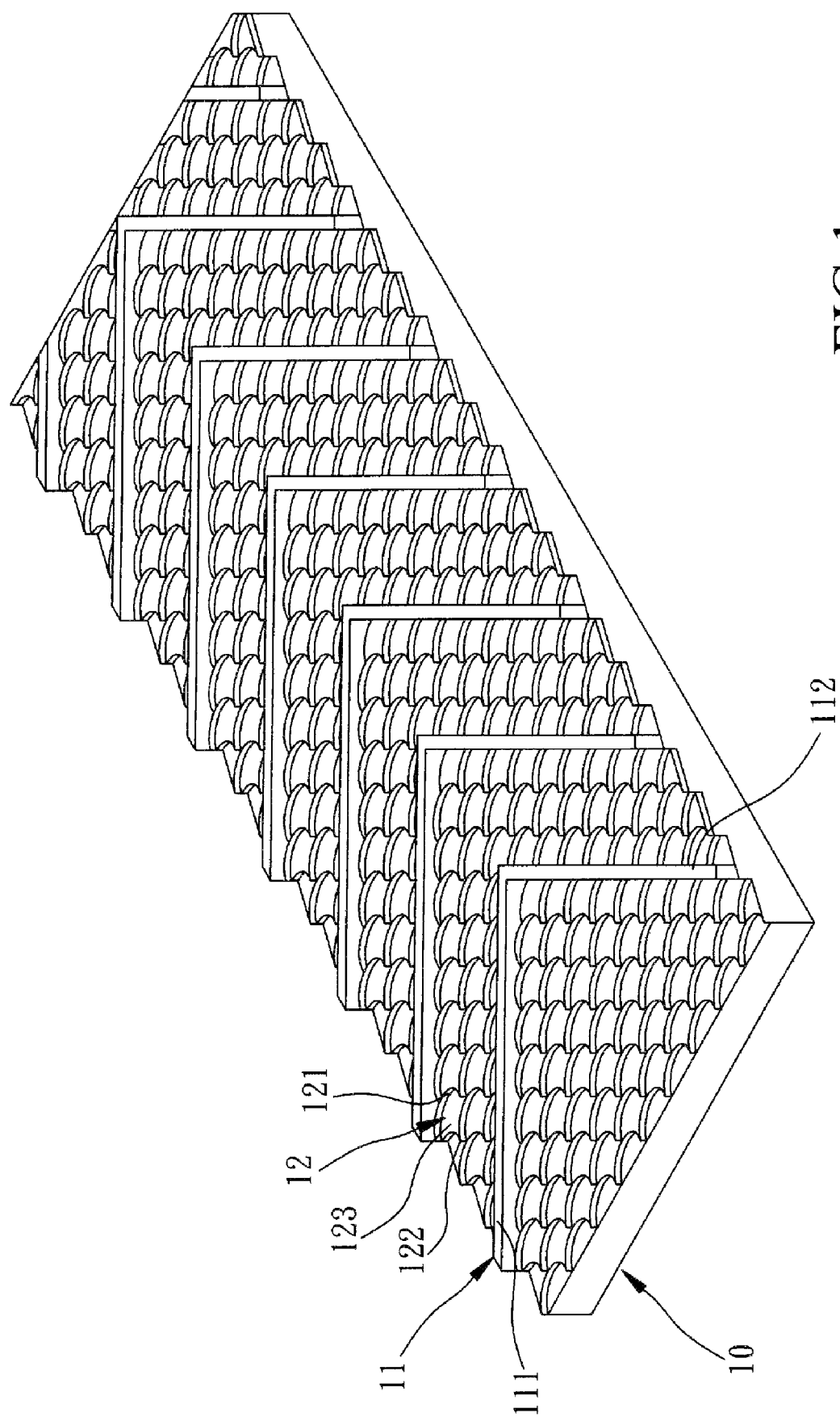
FIG. 1 is a perspective view of a preferred embodiment of a heat dissipation device with coarse surface capable of intensifying heat transfer according to the present invention.
Figure 2:
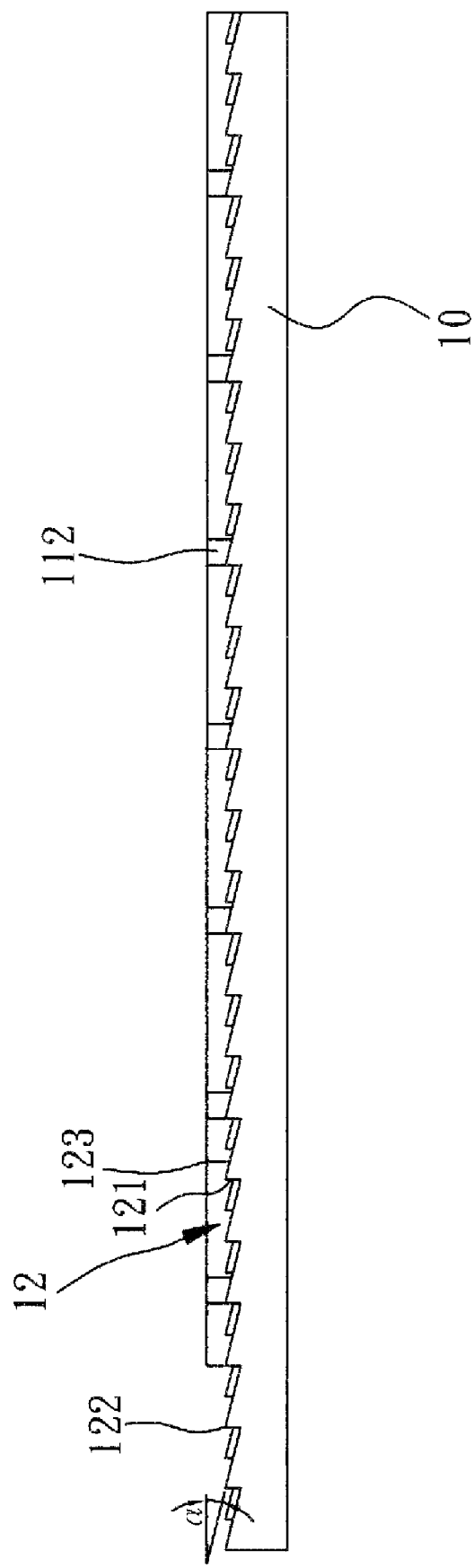
FIG. 2 is a side view of the heat dissipation device shown in FIG. 1.

Referring to FIGS. 1 and 2, a heat dissipation device with coarse surface capable of intensifying heat transfer according to the present invention includes a main body 10, which provides an upper surface and a heat transfer intensifying unit on the surface. The heat transfer intensifying unit further includes at least a partition member 11 and a plurality of fish-scale-like parts 12. The main body 10 has a thickness depending on the need of the user and has a geometric shape such as square, rectangle, circle, a diamond or any other shapes suitable for the user. The main body 10 shown in FIGS. 1 and 2 is rectangular for explanation only.

There are a plurality of partition members 11 shown in FIG. 1 and the partition members 11 are disposed apart a distance from each other to provide a plurality of partitioned zones such that the fish-scale-like parts 12 are disposed in each of the partition zones. Each partition member 11 extends upright from the upper surface and provides a first partition 111 and a second partition 112, which extend along a direction respectively from two opposite lateral sides of the surface and intersect at the middle of the surface. Hence, an included angle θ is constituted between the two partition members 111, 112. It is preferable that the included angle θ is less than 90°, that is, the respective raised part 11 is provided with the letter of "V" on the surface of the main body 10.

There are a plurality of partition members 11 shown in FIG. 1 and the partition members 11 are disposed apart a distance from each other to provide a plurality of partitioned zones such that the fish-scale-like parts 12 are disposed in each of the partition zones. Each partition member 11 extends upright from the upper surface and provides a first partition 111 and a second partition 112, which extend along a direction respectively from two opposite lateral sides of the surface and intersect at the middle of the surface. Hence, an included angle θ is constituted between the two partitions 111, 112. It is preferable that the included angle θ is less than 90°, that is, the respective partition member 11 is provided with the letter of "V" on the surface of the main body 10.

Figure 3:
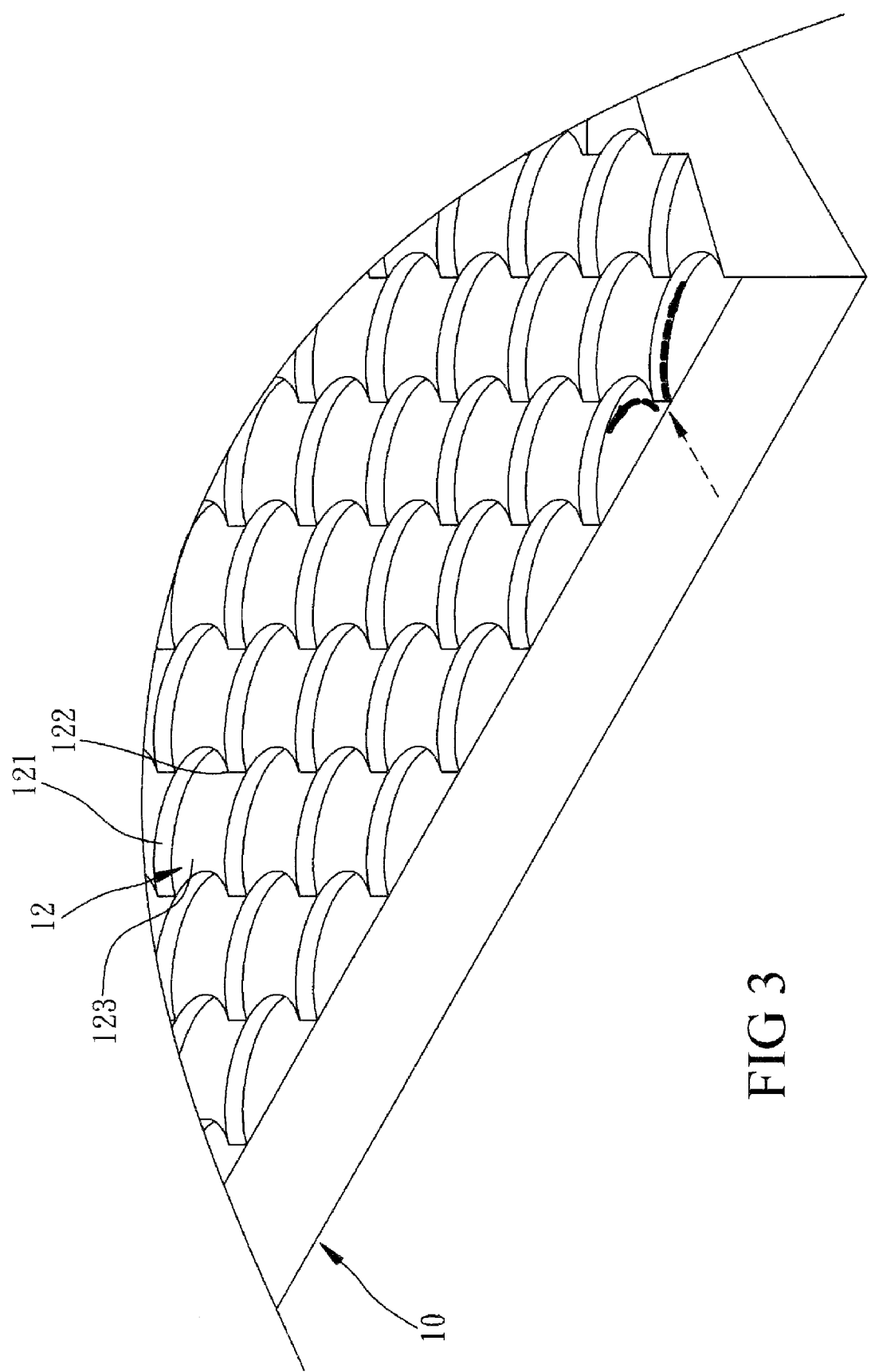
FIG. 3 is a fragmentary perspective view of the heat dissipation device shown in FIG. 1 illustrating fluid passing over the surface of the heat dissipation device.

The preceding fish-scale-like parts 12 are disposed on the upper surface of the main body 10 and each of the fish-scale-like parts 12 has a slant 123 inclining toward the upper surface of the main body 10 with an inclining angle α with respect to an imaginable plane parallel to the surface. Further, the respective fish-scale-like part 12 has a curved vertical edge 121, the bottom of the vertical edge 121 intersecting slant 123 and both ends of the curved vertical edge 121 being a sharp end 122 respectively as shown in FIGS. 2 and 3. The fish-scale-like parts 12 are arranged and distributed on the upper surface of the main body 10 side by side orderly and partitioned with the partition members 11 with the sharp ends 122 at each row of the fish-scale-like parts 12 being joined to each other successively.

It is noted that the respective raised part 11 can be semi-circular or in parallel instead of "V" shape shown in FIG. 1 and the fish-scale-like parts can scattered on the surface of the main body 10 instead of being arranged in order on the surface of the main body 10.

Figure 4:
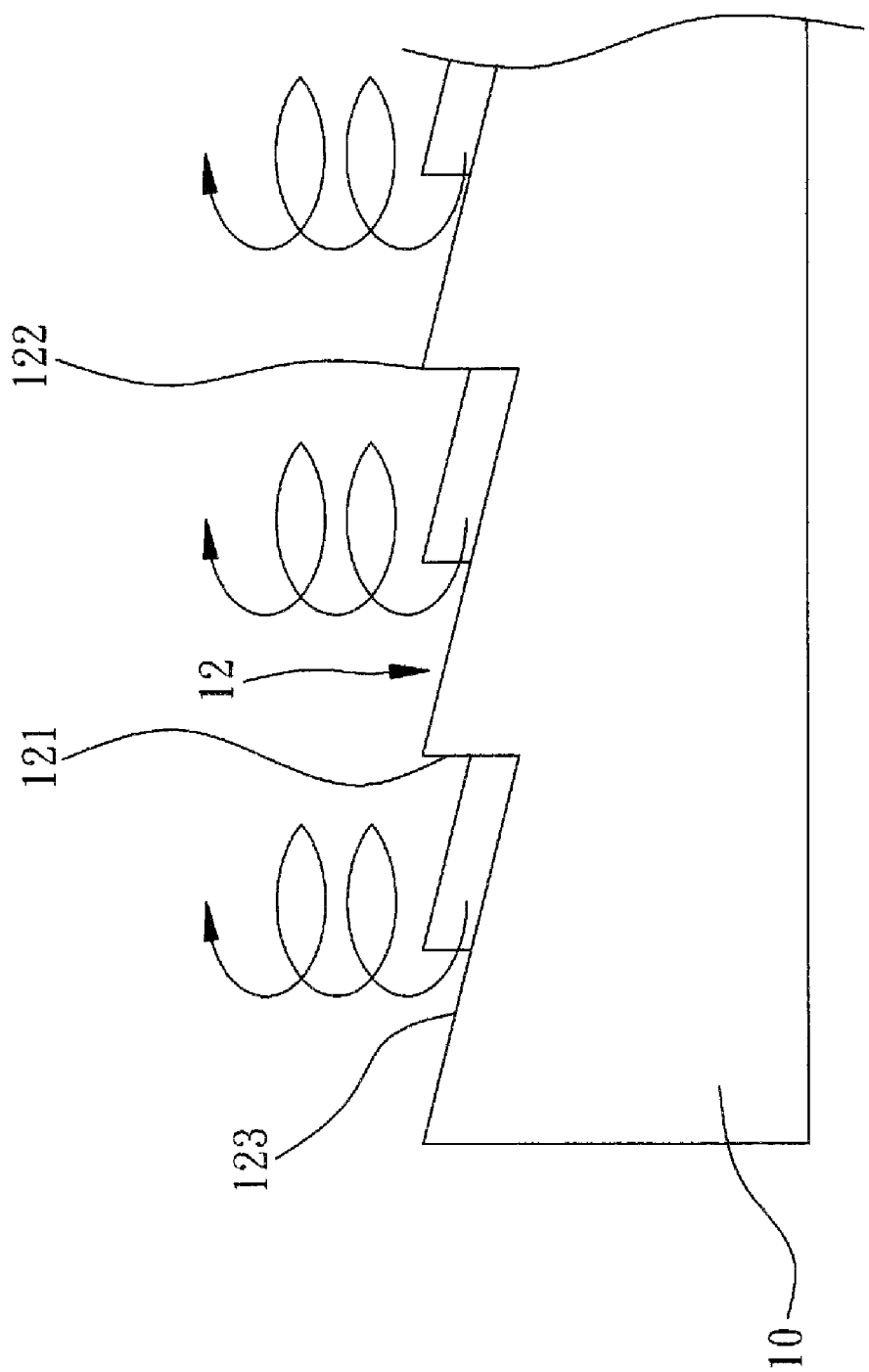
FIG. 4 is a plan view illustrating the fluid creating eddy flows at recesses of the fish-scale like surface of the heat dissipation device.

Referring to FIGS. 3 and 4, when the fluid flows over the surface of the main body 10 along a direction facing the included angle θ, the fluid near the surface of the main body 10 is restricted to move downward along the vertical edge 121 of the respective fish-scale-like part 12 when the fluid meets the sharp end 122. Under this circumference, the fluid is capable of flowing periodically to creates eddy flow at the sunk spot of the fish-scale-like part 12 and the eddy flow increases along with increase of the Reynolds number such that the eddy flow mixes the flow over the surface of the main body 10 to form secondary flow for intensifying turbulence of the fluid and enhancing efficiency of heat transfer. More over, the flat outer face 123 of the respective fish-scale-like part 12 is capable of breaking boundary layer periodically to result in renewing development of the boundary layer such that mixture of the fluid can be improved to promote effect of the heat transfer due to increase of eddy flow.

Additionally, when the fluid flows toward the included angle θ of the raised parts 11, the fluid is obliged to centralize to the central line of the main body 10 and then moves forward along the main flow direction of the fluid to mix with the main flow to result in the secondary flow is formed and the uniform flow is broken. Hence, the intensity of the turbulence is enhanced with extra area of heat transfer to improve effectiveness of the heat transfer.

While the invention has been described with referencing to preferred embodiments thereof, it is to be understood that modifications or variations may be easily made without departing from the spirit of this invention, which is defined by the appended claims.

What is claimed is:

1. A heat dissipation device with coarse surface capable of intensifying heat transfer comprising:
    a plate shaped main body with a periphery and an upper surface;
    a plurality of partition members being disposed slightly upright from said upper surface and apart a distance from each other to form a plurality of partitioned zones between said periphery and said partition members;
    a plurality of fish-scale-like parts being disposed at said partitioned zones orderly to form a plurality of rows of said fish-scale-like parts in each of said partition zones;
    wherein each of said fish-scale-like parts has a semi-circular vertical edge, a slant inclining toward said upper surface with a specific inclining angle with the bottom of the vertical edge intersecting the slant respectively; two ends of the respective vertical edges are sharp ends and the sharp ends at each of the rows of said fish-scale-like parts are joined to each other successively; each of said partition members has a first partition and a second partition extending from two opposite lateral sides of the periphery of said main body respectively and intersecting at the middle of said main body.

2. The heat dissipation device as defined in claim 1, wherein said fish-scale-like parts are arranged side by side orderly in said partition zones.

3. The heat dissipation device as defined in claim 1, wherein said fish-scale-like parts are disposed to scatter over said partition zones respectively.

4. The heat dissipation device as defined in claim 1, wherein said fish-scale-like parts are disposed side by side along an inclining direction in said partition zones.

5. The heat dissipation device as defined in claim 1, wherein said fish-scale-like parts are arranged side by side along two opposite inclining directions in said partition zones respectively.

6. The heat dissipation device as defined in claim 1, wherein each of said partition members constitutes a shape of "V".

7. The heat dissipation device as defined in claim 1, wherein the respective fish-scale-like part provides a smooth outer surface.

8. The heat dissipation device as defined in claim 1, wherein said partition members provide an outline of a semi-square respectively.

9. The heat dissipation device as defined in claim 1, wherein said partition members provide an outline of a semi-circle respectively.

* * * * *